United States Patent [19]

Davey

[11] 4,427,714
[45] Jan. 24, 1984

[54] THIN FILMS OF COMPOUNDS AND ALLOY COMPOUNDS OF GROUP III AND GROUP V ELEMENTS

[75] Inventor: Keith S. A. Davey, Royston, England

[73] Assignee: PA Management Consultants Limited, London, England

[21] Appl. No.: 338,094

[22] Filed: Jan. 8, 1982

[30] Foreign Application Priority Data

Jan. 16, 1981 [GB] United Kingdom ................. 8101396

[51] Int. Cl.³ ............................................ C04B 35/00
[52] U.S. Cl. ..................................... 427/87; 136/262; 252/62.3 GA
[58] Field of Search ...................... 427/74, 86, 87, 250; 420/555, 579; 252/62.3 GA; 136/262

[56] References Cited

U.S. PATENT DOCUMENTS 4,308,078 12/1981 Cook .................................... 136/262
4,327,119 4/1982 Lis et al. ............................... 427/74

OTHER PUBLICATIONS

Chamberlain, R. R., "Chemical Spray Deposition for Inorganic Films" *Journal of the Electrochemical Society*, vol. 113, No. 1, pp. 86–89 (Jan. 1966).

Manasevit, H. M., "The Use of Metal Organics in the Preparation of Semiconductor Materials I. Epitaxial Gallium V Compounds" *Journal of the Electrochemical Society* vol. 116, No. 12, pp. 1725–1732 (1969).

*Primary Examiner*—Edward J. Meros
*Assistant Examiner*—Jackson Leeds
*Attorney, Agent, or Firm*—Howard H. Darbo

[57] ABSTRACT

A thin film of a compound or alloy compound of Group III and Group V elements, particularly of gallium arsenide or gallium arsenide compounds, is produced by impinging, e.g. spraying, onto a heated substrate a liquid or liquids comprising molecules carrying the constituent elements of the desired film.

The constituent elements react together on or immediately above the heated substrate to form the desired compound or alloy compound which is deposited on the substrate in the form of a thin film. The resulting thin films may be used in solar cells and other opto-electronic devices.

7 Claims, No Drawings

THIN FILMS OF COMPOUNDS AND ALLOY COMPOUNDS OF GROUP III AND GROUP V ELEMENTS

DESCRIPTION

1. Field of Invention

This invention relates to thin films of compounds and alloy compounds of elements drawn from Group III and Group V of the periodic table, and is concerned particularly, but not exclusively, with the production of thin films of gallium arsenide or gallium arsenide compounds, for example for use in solar cells.

2. Background to the Invention

In bulk form gallium arsenide, or gallium arsenide compounds, can be used as the active semiconductor in solar cells with high conversion efficiency. Gallium arsenide is expensive so in order to reduce cell cost it is desirable to produce cells which use only very thin films of gallium arsenide while nevertheless retaining high conversion efficiency. Accordingly, the art has sought a method of producing photovoltaic cells with thin films of gallium arsenide using a manufacturing process which enables low cost mass production of large areas of cells.

Various methods are known for producing solar cells incorporating thin films of gallium arsenide and these known methods all use chemical vapour deposition (CVD) processes to produce the films. These CVD processes are similar to those used for the manufacture of expensive small area opto electronic components such as laser emitters. The CVD processes use at least two gaseous species separately containing gallium and arsenic-carrying molecules which react together when passed over a heated substrate to produce a thin film of gallium arsenide. The substrates are small and heated to a high temperature. Typically the reactant species are gaseous trimethylgallium and arsine gas, or gaseous gallium chloride and arsine gas.

The gaseous reactants used in such known methods are difficult to contain, meter and control in the reaction area. In addition the particular reactions employed require high substrate temperatures to produce thin film gallium arsenide solar cells with suitable performance characteristics. These problems have resulted in the CVD manufacturing process requiring expensive complex equipment which produces solar cells of relatively small area.

THE INVENTION

According to one aspect of the present invention there is provided a method of producing a thin film of a compound or alloy compound of Group III and Group V elements, comprising impinging onto a heated substrate a liquid or liquids comprising molecules carrying the constituent elements of the desired film.

Whem practising the method of the invention on, or immediately above, the heated substrate for constituent elements of the compound or alloy compound to be produced react together to form the desired component or alloy compound which is deposited on the substrate in the form of a thin film.

The invention may be used for producing various types of thin film suitable for various different applications, including, for example, the production of thin films for use in large area light emitting diodes. Use of the invention for this purpose enables the production of large area displays at low cost.

The invention also finds particular application in the production of thin films of gallium arsenide or gallium arsenide compounds, e.g. for use in solar cells.

Hence, in a preferred aspect the present invention provides a method of producing a thin film of gallium arsenide or a gallium arsenide compound, comprising impinging onto a heated substrate a liquid or liquids comprising gallium and arsenic carrying molecules.

With this preferred method, the electrical characteristics of the film can be controlled to produce the desired properties for good solar cell operation by doping the gallium arsenide with small quantities of additional elements as is known in the art. The doping conditions can be made by adding suitable dopant-containing compounds to the liquid(s) to be impinged.

The resulting thin film of gallium arsenide produced by this preferred method can be used to produce solar cells with any of the following structures. Schottky barrier, metal-oxide-semiconductor, p/n homojunction, p/n heterojunction. The layer structure of these cell types is well known in the art.

The liquid or liquids are conveniently sprayed onto the heated substrate.

A suitable substrate is selected depending upon the intended use of the thin film. For example, in the case of a thin film of gallium arsenide for use in a solar cell suitable substrates include glass, conductive oxide coated glass, graphite and metal coated graphite.

The substrate temperature is selected depending upon the desired properties of the film to be formed and the intended use thereof. In the case of a gallium arsenide film for use in a solar cell a suitable temperature is in the range of 200° C. and 750° C., being selected to give optimum conversion efficiency for the chosen cell structure and spray system.

Suitable systems for the deposition of gallium arsenide thin films include:

(1) spraying a solution of gallium arsenide or a precursor thereof with an inert gas propellant, in a reducing gaseous atmosphere;

(2) spraying a solution of a gallium/arsenic complex with an inert gas propellant in an inert or reducing atmosphere. In this case the gallium/arsenic complex could be formed from precursors of the type $R_3Ga$ where R is methyl, ethyl, phenyl chloride, and $AsT_3$ where T is hydrogen, chlorine, methyl, ethyl or phenyl;

(3) creating a stable aerosol of trimethyl gallium dispersed in arsine gas, decomposed on the hot substrate in an inert atmosphere.

(4) spraying a polymeric complex formed between trimethyl gallium and methyl/phenyl arsine, using an inert propellant gas in an inert atmosphere.

In any of the above cases a suitable inert gas could be dry nitrogen and a suitable reducing gas could be forming gas.

The method of the invention may also be used for the production of thin film alloys suitable for use in solar cells and other opto-electronic devices, including aluminium gallium arsenide, gallium aluminium arsenic antimonide, gallium indium arsenide, and aluminium gallium indium arsenide.

The present invention also includes within its scope a thin film produced by the method of the invention.

In yet a further aspect the present invention provides a solar cell incorporating a thin film of gallium arsenide or gallium arsenide compound produced by the method of the invention.

I claim:

1. A method of producing a thin film of gallium arsenide comprising impinging onto a heated substrate a solution of gallium arsenate or a precursor thereof with an inert gas propellant, in a reducing gaseous atmosphere.

2. A method according to claim 1, wherein the substrate is selected from amongst glass, conductive oxide coated glass, graphite and metal coated graphite.

3. A method according to claim 1, wherein the substrate temperature is in the range 200° C. and 750° C.

4. A method of producing a thin film of gallium arsenide comprising impinging onto a heated substrate a solution of a gallium/arsenic complex with an inert gas propelled in an inert or reducing atmosphere, wherein the gallium/arsenic complex is formed from precursors of the type $R_3Ga$ where R is phenyl chloride, and $AsT_3$ where T is chlorine, methyl, ethyl or phenyl.

5. A method of producing a thin film of gallium arsenide comprising impinging onto a heated substrate a polymeric complex formed between trimethyl gallium and methyl/phenyl arsine, using an inert propellant gas in an inert atmosphere.

6. A method according to claim 5, wherein the substrate is selected from amongst glass, conductive oxide coated glass, graphite and metal coated graphite.

7. A method according to claim 5, wherein the substrate temperature is in the range 200° C. and 750° C.

* * * * *

UNITED STATES PATENT AND TRADEMARK OFFICE
CERTIFICATE OF CORRECTION

PATENT NO. : 4,427,714
DATED : January 24, 1984
INVENTOR(S) : Keith Simon Alexander Davey It is certified that error appears in the above-identified patent and that said Letters Patent are hereby corrected as shown below:

On the title page

CHANGE THE NAME OF THE ASSIGNEE FROM P A MANAGEMENT CONSULTANTS LIMITED TO P.A. CONSULTING SERVICES LIMITED.

Signed and Sealed this

Twenty-fifth Day of June 1985

[SEAL]

Attest:

DONALD J. QUIGG

Attesting Officer

Acting Commissioner of Patents and Trademarks